United States Patent [19]

Almenräder et al.

[11] Patent Number: 4,953,004
[45] Date of Patent: Aug. 28, 1990

[54] HOUSING FOR A GATE TURN-OFF POWER THYRISTOR (GTO)

[75] Inventors: Peter Almenräder, Staufen; Jiri Dlouhy, Mägenwil, both of Switzerland

[73] Assignee: BBC Brown Boveri AG, Baden, Switzerland

[21] Appl. No.: 284,360

[22] Filed: Dec. 14, 1988

[30] Foreign Application Priority Data

Dec. 14, 1987 [CH] Switzerland ............. 4865/87

[51] Int. Cl.$^5$ .............. H01L 23/42; H01L 23/44; H01L 23/46
[52] U.S. Cl. ......................... 357/79; 357/74; 357/38
[58] Field of Search ............ 357/74, 75, 76, 79, 357/39, 38; 174/52

[56] References Cited

U.S. PATENT DOCUMENTS

| | | | |
|---|---|---|---|
| 3,487,271 | 12/1969 | Laffert | 357/79 |
| 4,008,486 | 2/1977 | Byczkowski | 357/74 |
| 4,158,850 | 6/1979 | Lehmann | 357/38 |
| 4,628,147 | 12/1986 | Bennett | 357/74 |

FOREIGN PATENT DOCUMENTS 2313774 12/1976 France .

OTHER PUBLICATIONS

BBC Brown Boveri, No. CH-EC 1023 87 D/E/F, May 1987, pp. 2 & 3.
BBC Brown Boveri, DHL 278804 DEF, p. 27.
"Siemens Components", 25(1987), No. 1, pp. 24–26.

Primary Examiner—William D. Larkins
Assistant Examiner—Don Monin
Attorney, Agent, or Firm—Oblon, Spivak, McClelland, Maier & Neustadt

[57] ABSTRACT

In a metal-ceramic housing for a high-power GTO, a space-saving auxiliary cathode connection (5a) capable of carrying current is achieved in that it is constructed by embedding in the insulating ring (4) of the housing and is connected directly to the cathode contact plate (9) via its own connecting elements (11, 13, 15).

4 Claims, 1 Drawing Sheet

HOUSING FOR A GATE TURN-OFF POWER THYRISTOR (GTO)

BACKGROUND OF THE INVENTION

1. Field of the Invention

The present invention relates to the field of power electronics. It relates in particular to a housing for a gate turn-off power thyristor (GTO) comprising
an anode contact plate;
a cathode contact plate, a mounting space being provided between the two plates for the active semiconductor component;
an insulating ring surrounding the mounting space;
an anode flange which joins the insulating ring on the anode side to the anode contact plate;
a cathode flange which joins the insulating ring on the cathode side to the cathode contact plate; and
an auxiliary cathode connectio which is connected to the cathode contact plate.

Such a housing is known, for example, from the publication entitled "Siemens Components", 25 (1987), No. 1, pages 24–26.

2. Discussion of Background

Power thyristors for currents from a few 100 to a few 1000 amperes and reverse voltages of several 1000 volts impose special requirements on the housing in which the actual active semiconductor component is mounted.

In conventional power thyristors without gate turn-off, a metal-ceramic housing is generally used, as can be gathered, for example, from the U.S. Pat. No. 4,008,486 or the data sheet CH-EC 1023 87 D/E/F issued by BBC Brown Boveri AG from the Thyristor CS 2402.

Such a metal-ceramic housing comprises a cylindrical ceramic insulating ring, which surrounds the actual semiconductor component. To make electrical and thermal contact to the semiconductor component, there are provided a metallic anode contact plate on the anode side and a metallic cathode contact plate on the cathode side which press on the semiconductor component in the mounted state.

Both contact plates are joined to the insulating ring via a metallic anode or cathode flange respectively so that a hermetically sealed housing is produced.

The access to the gate of the thyristor component is normally achieved through a gate connection which is embedded in the insulating ring and makes possible an electrical connection through the insulating ring from the interior of the housing to the outside.

In addition to the gate connection, an auxiliary cathode connection may also be provided with is electrically connected to the cathode contact plate. This auxiliary cathode connection makes an additional connection to the cathode possible without recourse having to be made to the main contact area of the cathode contact plate.

In the case of the conventional power thyristors two embodiments of auxiliary cathode connections are, however, known: in one embodiment, the auxiliary cathode connection is constructed as a rectangular connector, and specifically either as an integrated part of the cathode flange (U.S. Pat. No. 4,008,486), or as an additional metal sheet strip attached to the cathode flange (data sheet CS 2402).

In the other embodiment, the auxiliary cathode connection is embedded, like the gate connection, in the insulating ring and is connected to the cathode flange via a metallization bridge deposited on the inside of the insulating ring (see, for example, data sheet DHF 278084 DEF issued by BBC Brown Boveri AG, page 27 for the type CSF 369).

The application of these embodiments depends, in particular, on the type of housing seal: if the housing is sealed by means of cold welding, the metal flanges have a relatively large projection beyond the insulating ring. In this case, the auxiliary cathode connection integrated in the insulating ring is used (second embodiment).

If the housing is sealed, on the other hand, by means of plasma welding, the projection is small or not present at all. In this case, soldered-on or welded-on rectangular connectors (so-called Faston connectors) are used which are fitted to the cathode flange (or the cathode cap).

In the case of the gate turn-off power thyristor (GTO), the situation changes fundamentally. In this component, the auxiliary cathode connection is also used as second electrode for the gate circuit. However, in this case it has to be designed for the high gate currents (up to 800 A) which are required for turning off and which do not occur in the conventional thyristor.

From the publication (FIG. 5) mentioned in the introduction, however, the use of a rectangular connector mounted on the flange is also known in a housing for a high-power GTO.

However, the transfer of the embodiments of the auxiliary cathode connection of conventional thyristors to GTOs is associated with the following problems: in the case of cold-welded housings, the use of a welded-on rectangular connector is not possible since projection of the connector beyond the flanges is not permitted by the specifications. On the other hand, the metallization bridges (cross section, for example, 0.75 mm$^2$) used in an integrated auxiliary cathode connection are too weak for the gate currents encountered, so that open circuits occur at the edges of the bridges.

In plasma-welded housings, the previous rectangular connector arrangement require considerable space, project far beyond the housing and make the clamping of the thyristor to the cooling device more difficult because they are very near to the connecting area of the cathode contact plate. In addition, the dimensions of the rectangular connectors (width $\times$ metal sheet thickness, for example, 6.3 $\times$ 0.8 mm$^2$) are too small for gate currents of up to 800 A.

In both cases, the voltage drop between the cathode contact plate and the auxiliary cathode connection is also too large.

SUMMARY OF THE INVENTION

Accordingly, the object of this invention is to form the auxiliary cathode connection in a high-power GTO in such a way that it is possible both to transmit the necessary gate currents reliably and to use any desired housing seals.

The object is achieved in a housing of the type mentioned in the introduction wherein
the auxiliary cathode connection passes out of the housing through the insulating ring to the outside, and
is directly connected to the cathode contact plate.

The essence of the invention is therefore to use a space-saving auxiliary cathode connection which is integrated in the insulating ring and is no longer connected via a weak metallization bridge and the cathode flange but is connected directly to the cathode contact plate.

This direct connection can be designed without restriction for very high currents.

According to a first preferred exemplary embodiment of the invention, the direct connection between the auxiliary cathode connection and the cathode contact plate comprises an internal pin, an external pin and a connecting piece situated in between.

According to a further preferred exemplary embodiment, this connecting piece has a compensation loop.

The advantages of this arrangement are in a great flexibility in dimensioning and assembly and also in a compensation for the thermal expansion.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1A:
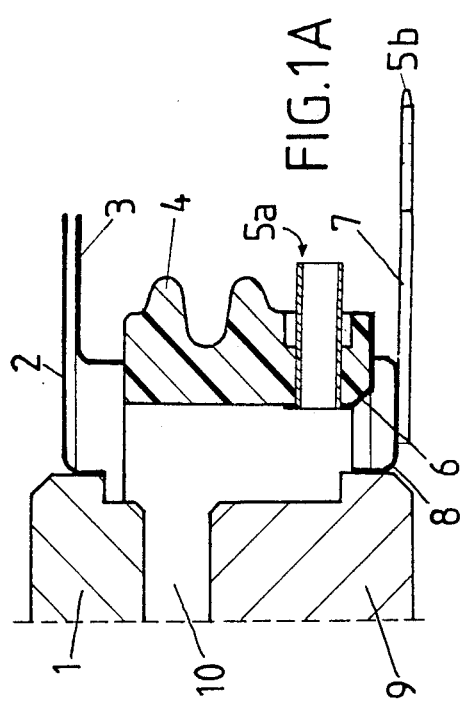
FIG. 1A shows, in cross section and in a combined representation, two embodiments of an auxiliary cathode connection according to the prior art.

Referring now to the drawings, wherein like reference numerals designate indentical or corresponding parts throughout the several views, FIG. 1A shows, in cross section, a housing arrangement for a high-power thyristor with auxiliary cathode connection according to the prior art, two different structural variants for this auxiliary cathode connection being shown at the same time for the sake of simplicity.

The known housing comprises an anode contact plate 1 and a cathode contact plate 9 which are situated opposite each other and limit between them a mounting space 10 which is provided for receiving the active semiconductor component.

The mounting space 10 is surrounded by a cylindrical insulating ring 4 (normally composed of a ceramic). The insulating ring 4 is joined on the anode side to the anode contact plate 1 via an anode flange composed of a lower anode flange 3 and an upper anode flange 2.

On the cathode side, a corresponding cathode flange 8 produces the mechanical joint between the insulating ring 4 and the cathode contact plate 9.

FIG. 1A shows the housing in the still unclosed state since the upper and lower anode flange 2 or 3 are not yet joined to each other. The hermetic seal takes place either by cold welding or by plasma welding of these two flange parts.

If the seal takes place by cold welding, the two flange parts, as shown in the Figure, have flange areas projecting far beyond the insulating ring 4. In this case, a first auxiliary cathode connection 5a is provided which is embedded in the insulating ring 4 in the form of a small metal tube and is in electrical contact with the cathode contact plate 9 via a metallization bridge 6 on the inside of the insulating ring 4 and via the metallic cathode flange 8.

If the seal takes place by plasma welding, the anode flange (2, 3) only projects slightly or not at all beyond the insulating ring 4 (this case is not shown explicitly in FIG. 1A). In this case a rectangular connector 7 which is soldered or spot-welded onto the outside of the cathode flange 8 is provided as another, second auxiliary cathode connection 5b.

Figure 1B:
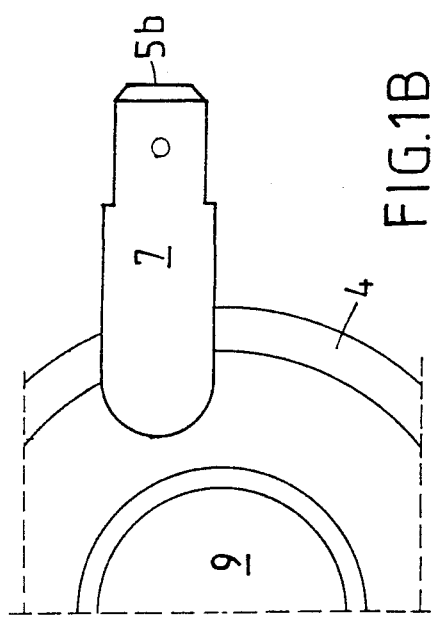
FIG. 1B shows the corresponding plan view for one of the embodiments according to the prior art.

A plan view of this second auxiliary cathode contact 5b is shown once again in FIG. 1B in order to make clear the large projection of the rectangular connector 7 beyond the insulating ring 4.

Figure 2A:
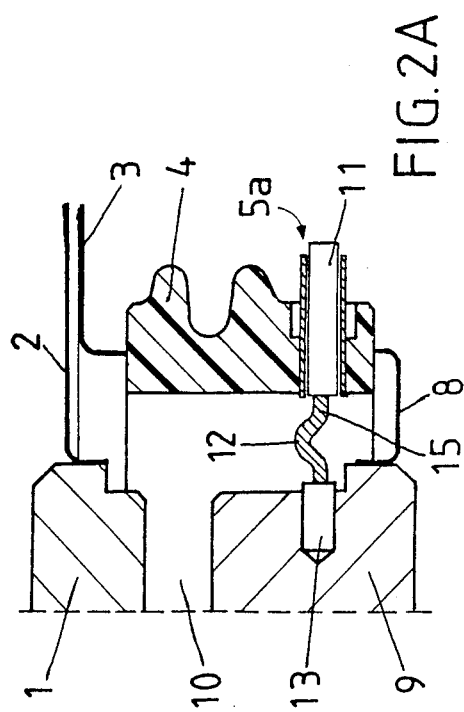
FIGS. 2A, B show, in two different cross sectional views, a GTO auxiliary cathode connection according to a preferred exemplary embodiment of the invention.

FIG. 2A shows, however, in a representation corresponding to FIG. 1A, a preferred embodiment of the auxiliary cathode contact according to the invention. Here, again, the auxiliary cathode contact 5a is integrated in the form of a small metal tube in the insulating ring 4.

In contrast of FIG. 1A, however, it is in this case directly connected to the cathode contact plate 9. This direct connection comprises an internal pin 13 composed of metal, an external pin 11, also composed of metal, and a metallic connecting element 15 arranged between the two pins 11, 13.

It is obvious that the connecting pieces 11, 13 and 15 are composed of a metal, (for example Cu) with good electrical conduction which is also readily solderable.

The pins 11, 13 and the connecting piece 15 are permanently connected to each other. It is also conceivable to manufacture the connection from a single piece.

The internal pin 13 is brazed into a corresponding blind hole in the cathode contact plate 9, while the external pin 11 is soldered to the small metal tube of the auxiliary cathode connection.

At the same time, the cross sections of the individual connecting elements 11, 13 and 15 are so chosen that the anticipated gate currents can be conducted reliably and without a large voltage drop through the housing.

Since varying temperature occur during the operation of the component, it is preferable to provide, in the connecting piece 15, a compensation loop 12 which gives the connection the necessary mechanical play to compensate for the thermal expansion. At the same time, a solid connecting piece 15 is conceivable but so is a stranded wire.

Figure 2B:
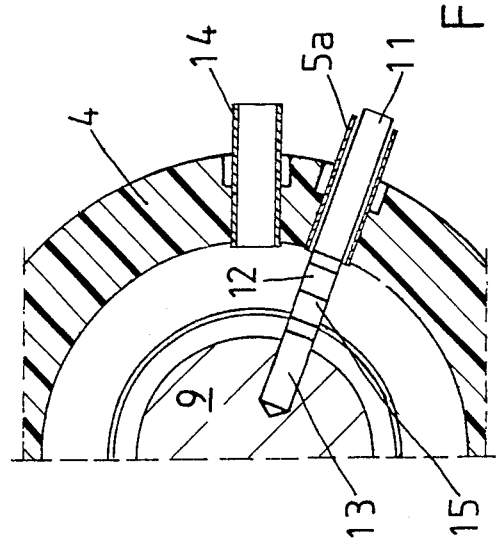

FIG. 2B shows the embodiment according to FIG. 2A in a cross sectional plane perpendicular to the axis of the housing. It can be seen here that the auxiliary cathode connection 5a and its direct connection (11, 13, 15) are approximately radially arranged and can be placed, for example, in the vicinity of a gate connection 14 which is also integrated.

The integrated construction, according to the invention, of the auxiliary cathode connection with direct connection to the cathode contact plate results in a substantial reduction of the projection piece, can be designed for very high currents without restriction and offers a simple assembly of the housing, because of the joint can be assembled together with the other component of the housing in a soldering jig and brazed.

Furthermore, the integrated auxiliary cathode connection avoids problems of space on the cathode side and can be combined with all types of housing seal.

Obviously, numerous modifications and variations of the present invention are possible in the light of the above teachings. It is therefore to be understood that within the scope of the appended claims, the invention may be practiced otherwise than as specifically described herein.

What is claimed as new and desired to be secured by Letters Patent of the United States is:

1. A housing for a gate turn-off power thyristor (GTO), comprising:
   (a) an anode contact plate;
   (b) a cathode contact plate, a mounting space being provided between the two plates for the active semiconductor component;
   (c) an insulating ring surrounding the mounting space;
   (d) an anode flange which joins the insulating ring on the anode side to the anode contact plate;
   (e) a cathode flange which joins the insulating ring on the cathode side to the cathode contact plate; and
   (f) an auxiliary cathode connection which is connected to the cathode contact plate;
   (g) the auxiliary cathode connection comprising a bulk conductor which passes out of the housing through the insulating ring to the outside; and
   (h) said bulk conductor extending from the insulating ring through the mounting space and directly connected to the cathode contact plate.

2. A housing for a gate turn-off power thyristor (GTO), comprising:
   (a) an anode contact plate;
   (b) a cathode contact plate, a mounting space being provided between the two plates for the active semiconductor component;
   (c) an insulating ring surrounding the mounting space;
   (d) an anode flange which joins the insulating ring on the anode side to the anode contact plate;
   (e) a cathode flange which joins the insulating ring on the cathode side to the cathode contact plate; and
   (f) an auxiliary cathode connection which is connected to the cathode contact plate;
   (g) the auxiliary cathode connection comprising a bulk conductor which passes out of the housing through the insulating ring to the outside; and
   (h) said bulk conductor extending from the insulating ring through the mounting space and directly connected to the cathode contact plate;
   wherein the bulk conductor comprises an internal pin, an external pin, and a connecting piece situated in between.

3. The housing as claimed in claim 2, wherein the connecting piece has a compensation loop.

4. The housing as claimed in claim 3, wherein the internal pin is brazed into a blind hole let into the cathode contact plate.

* * * * *